(12) United States Patent
Kurosaka et al.

(10) Patent No.: US 6,171,393 B1
(45) Date of Patent: Jan. 9, 2001

(54) SEED CRYSTAL AND METHOD OF MANUFACTURING SINGLE CRYSTAL

(75) Inventors: Shoei Kurosaka; Junsuke Tomioka; Masakazu Kobayashi; Shuji Onoue; Tsuyoshi Sadamatsu, all of Kanagawa (JP)

(73) Assignee: Komatsu Electronic Metals Co., Ltd., Kanagawa (JP)

( * ) Notice: Under 35 U.S.C. 154(b), the term of this patent shall be extended for 0 days.

(21) Appl. No.: 09/251,399

(22) Filed: Feb. 17, 1999

(30) Foreign Application Priority Data

Feb. 18, 1998 (JP) .................................................. 10-051302
Dec. 22, 1998 (JP) .................................................. 10-364420

(51) Int. Cl.$^7$ .................................................. C30B 15/36
(52) U.S. Cl. .............................. 117/35; 117/208; 117/902
(58) Field of Search ................................. 117/13, 35, 208, 117/217, 902; 428/582, 615, 621, 629, 641, 688

(56) References Cited

U.S. PATENT DOCUMENTS 5,916,364 * 6/1999 Izumi ..................................... 117/13
5,932,002 * 8/1999 Izumi ..................................... 117/13

* cited by examiner

Primary Examiner—Robert Kunemund
Assistant Examiner—Donald L. Champagne
(74) Attorney, Agent, or Firm—Sughrue, Mion, Zinn, Macpeak & Seas, PLLC

(57) ABSTRACT

A seed crystal 1 for manufacturing a single crystal incorporating an unconformity portion B formed at a predetermined position apart from a leading end thereof and structured to conduct the heat of melt and interrupt propagation of dislocation caused from thermal stress produced when dipping in the melt has been performed.

49 Claims, 15 Drawing Sheets

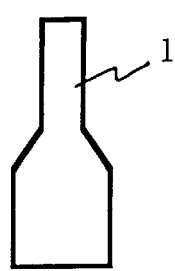 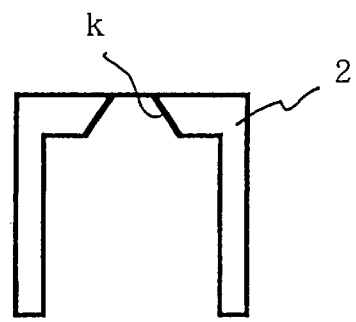
fig.5A
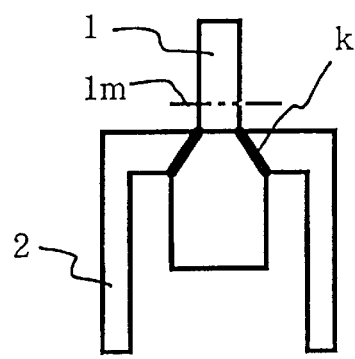
fig.5B
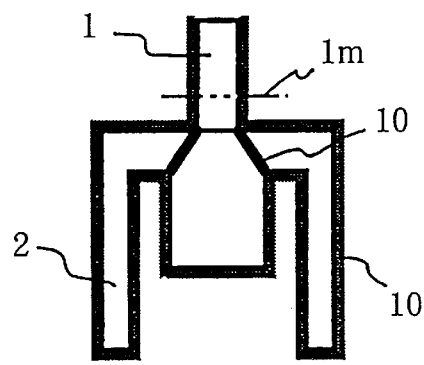
fig.5C
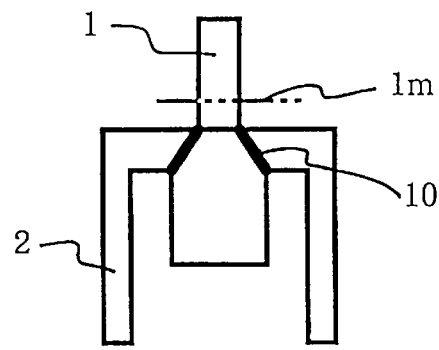
fig.5D

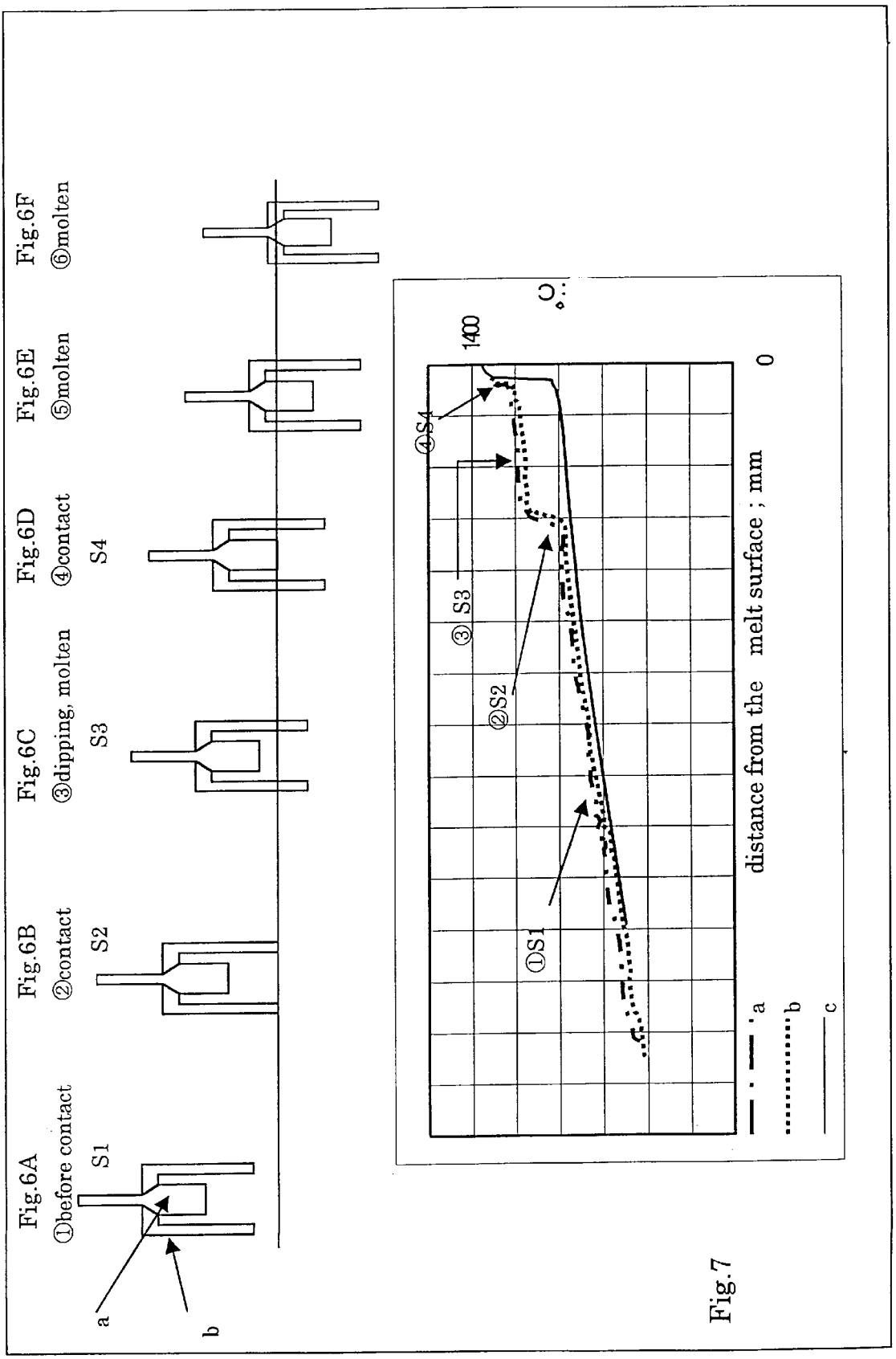

Distance between the seed crystal and the melt(mm)

Time(Min.)

SEED CRYSTAL AND METHOD OF MANUFACTURING SINGLE CRYSTAL

BACKGROUND OF THE INVENTION

1. Field of the Invention

The present invention relates to a seed crystal for manufacturing a single crystal for use in manufacturing a single crystal semiconductor by a CZ method, a method of manufacturing the seed crystal for manufacturing a single crystal and a method of manufacturing a single crystal using the seed crystal.

2. Description of the Related Art

Single crystals, for example, single crystal silicon, are usually produced using the following CZ method. A quartz crucible disposed in an apparatus for producing single crystals is filled with polycrystalline silicon. A heater disposed in the periphery of the quartz crucible heats and melts the polycrystalline silicon, to thereby prepare a melt. A seed crystal joined to a seed holder is dipped into the melt, and then the seed holder is raised while the seed holder and the quartz crucible are rotated in the same or opposite directions. In this manner, single crystal silicon is grown to have a predetermined diameter and length.

When the seed crystal is dipped in the melt, thermal stress is produced, thereby causing dislocation in the seed crystal. To remove the dislocation caused by the thermal stress, a Dash neck method is employed to form a neck portion having a diameter of 3–4 mm at a position below the seed crystal. Thus, the dislocation is relieved to the surface of the neck portion. After no dislocation has been confirmed, a shoulder portion is formed. Then, the seed crystal is enlarged to have a predetermined diameter, and then a process for forming a straight body portion is started.

In recent years, either the diameter of the seed crystal has been enlarged or the axial length has been elongated in order to efficiently manufacture semiconductor devices and improve a manufacturing yield. The results are an increase in weight of the single crystal has been enlarged, and the neck portion approaching its stress limit and possibly breaking. Thus, there is concern that this related method is not reliable. As a result, the single crystal cannot safely be grown. As a countermeasure, a variety of single crystal manufacturing methods, which do not use the Dash neck method, have been proposed. For example, (1) A method of raising the single crystal disclosed in Japanese Patent Laid-Open No. 9-249486 is structured to interrupt downward movement of the seed crystal at a position immediately above the melt so that pre-heating is performed. Then, the speed at which the seed crystal is moved downwards is gradually reduced when the seed crystal is dipped in the melt.

(2) A seed crystal for raising a single crystal disclosed in Japanese Patent Laid-Open No. 9-235186 has a conical leading end to reduce the thermal capacity. Thus, the temperature can easily be raised to the temperature of the melt.

(3) A method of raising a single crystal disclosed in Japanese Patent Laid-Open No. 9-249485 is structured to control the speed at which the seed crystal dipped in the melt to be very slow speed of 0.05–2 mm/minute. Thus, a dislocation portion, produced when the seed crystal is dipped into the melt, is melted.

(4) Moreover, a seed crystal having a hollow portion and a seed crystal having a bored side surface are employed to prevent a propagation of dislocation when they are dipped into the melt. In addition, a drawing process is omitted so as to enlarge the diameter of the non-dislocation seed crystal.

(5) A method of growing a seed crystal disclosed in Japanese Patent Laid-Open No. 4-104988 uses a seed crystal having a conical leading end is first pre-heated by a heater, and then dipped in the melt.

FIG. 18 is a graph showing change in the temperature at the leading end of a seed crystal realized when the seed crystal is gradually moved to approach the melt. The temperature at the leading end of the seed crystal is gradually raised in substantially proportion to the distance from the surface of the melt. While the rise in seed crystal temperature occurring before contact with the surface of the melt is limited,-simultaneously with the contact with the melt, the temperature rapidly increases upon contact. The dislocation produced when the seed crystal is dipped into the melt depends on the difference (100° C. or greater) in temperature between the seed crystal and the melt. Since this difference is 100° C. or greater, even if the seed crystal is held immediately above the melt, its temperature cannot be satisfactorily raised. Thus, it is understood that non-dislocation dipping is very difficult.

FIG. 19 is a graph showing a change in temperature at the leading end of the seed crystal as time elapses in a state in which the leading end of the seed crystal is secured 2.7 mm above the surface of the melt. If the seed crystal located at a still position above the surface of the melt, the temperature of which is 1420° C., is allowed to remain in position for a long time, the temperature thereof cannot be raised in proportion to elapsed time. The atmospheric pressure in the furnace is about tens of Torr and the temperature of the seed crystal cannot sufficiently be raised only by radiation from the melt. This is because of the thermal conductivities of argon gas and silicon (argon gas is 0.05 W/m·K and silicon is 22.08 W/m·K), despite the supply of argon gas.

Therefore, the conventional techniques have the following problems:

(1) Even if the seed crystal is allowed to stand still immediately above the melt, the temperature cannot be raised in proportion to the standstill time.

(2) Even if a seed crystal having a conical shaped leading end is employed, the success rate of non-dislocation dipping is unsatisfactorily low because of the difference in the temperature between the seed crystal and the melt.

(3) If the seed crystal encounters even very small dislocation when dipping in the melt is performed, the dislocation is continuously propagated upwards even though melting of the seed crystal is performed at a very low downward movement speed. Thus, elimination of the dislocation cannot easily be performed. Therefore, the success rate of non-dislocation dipping is very low.

A variety of suggestions have been made in the conventional methods to eliminate the difference in the temperature from that of the melt when the seed crystal is brought into contact with the melt or the dislocation appearing when the contact has been performed. As described above, a rate of being non-dislocation adaptable to the industrial production cannot easily be realized.

(4) The method of previously heating the seed crystal by using a heating means is a preferred method because of its directness. However, a method using, for example, a heater which is provided for the seed holder, results in the apparatus for manufacturing a single crystal being complicated.

SUMMARY OF THE INVENTION

In view of the foregoing, an object of the present invention is to provide a seed crystal for manufacturing a single crystal having a pre-heating means for reducing the difference in the temperature from that of melt prior to immersion of a seed crystal in the melt and capable of preventing propagation of dislocation.

An object of a method of manufacturing a seed crystal according to the present invention is to form a single crystal free from any dislocation and exhibiting excellent crystallinity.

A first aspect of the seed crystal is a seed crystal for manufacturing a single crystal of the present invention, which comprises an unconformity portion formed at a position apart from a leading end thereof and structured to conduct the heat of melt and interrupt propagation of dislocation caused from thermal stress produced when dipping in the melt has been performed.

A second aspect of the seed crystal is a seed crystal according to the first aspect, wherein a seed for growing a single crystal and a pre-dipping heat conducting member which is arranged to be dipped in the melt prior to dipping of the seed for growing a single crystal so as to conduct the heat of the melt to the seed for growing a single crystal, are joined to each other through an unconformity portion formed so as to conduct the heat of the melt from the pre-dipping heat conducting member to the seed for growing a single crystal and interrupt propagation of dislocation caused from thermal stress produced when dipping in the melt has been performed.

A third aspect of the seed crystal is a seed crystal according to the first aspect, wherein the pre-dipping heat conducting member is, through the unconformity portion, joined to a position below a position at which growing of the seed for growing a single crystal is started.

A fourth aspect of the seed crystal is a seed crystal according to the first aspect, wherein the pre-dipping heat conducting member is formed to have an engagement portion arranged to be engaged to the seed for growing a single crystal at a position of the side portion of the seed for growing a single crystal and cover the seed for growing a single crystal such that a constant distance is maintained, and the leading end of the pre-dipping heat conducting member is formed to project over the leading end of the seed for growing a single crystal. portion is positioned at the lower end of the seed for growing a single crystal and formed to be in parallel with the surface of the melt.

A tenth aspect of the seed crystal is a seed crystal according to the first aspect, wherein the unconformity portion is positioned at the lower end of the seed for A fifth aspect of the seed crystal is a seed crystal according to the fourth aspect, wherein the distance is sufficiently large such that penetration of the melt caused from surface tension can be prevented.

A sixth aspect of the seed crystal is a seed crystal according to the fifth aspect, wherein the seed for growing a single crystal has a large-diameter portion and a small-diameter portion and a small-diameter portion, and the pre-dipping heat conducting member is constituted by a cylinder having a hole through which the small-diameter portion can be inserted and at which the large-diameter portion is engaged.

A seventh aspect of the seed crystal is a seed crystal according to the sixth aspect, wherein the hole is formed into a tapered shape.

An eighth aspect of the seed crystal is a seed crystal according to the first aspect, wherein the unconformity portion is formed at the lower end of the seed for growing a single crystal and has a joining surface in the form of a dovetail joint.

A ninth aspect of the seed crystal is seed crystal according to the first aspect, wherein the unconformity portion is positioned at the lower end of the seed for growing a single crystal and formed to be in parallel with the surface of the melt.

A tenth aspect of the seed crystal is a seed crystal according to the first aspect, wherein the unconformity portion is positioned at the lower end of the seed for growing a single crystal and arranged to form a surface inclined with respect to the surface of the melt.

An eleventh aspect of the seed crystal is a seed crystal according to the first aspect, wherein the unconformity portion is positioned at the lower end of the seed for growing a single crystal and arranged to form a conical side surface.

A twelfth aspect of the seed crystal is a seed crystal according to the first aspect, wherein the seed for growing a single crystal is made of silicon.

A thirteenth aspect of the seed crystal is a seed crystal according to the twelfth aspect, wherein the pre-dipping heat conducting member is made of silicon, which is connected to the seed for growing a single crystal through any one of a silicon oxide film, a silicon nitride film and a polycrystalline silicon film which constitute the unconformity portion.

A fourteenth aspect of the seed crystal is a seed crystal according to the thirteenth aspect, wherein the unconformity portion is a silicon oxide film formed by bringing the pre-dipping heat conducting member and the seed for growing a single crystal into contact with each other and by subsequent oxidation of the contact portion.

A fifteenth aspect of the seed crystal is a seed crystal according to the thirteenth aspect, wherein the silicon is high-purity silicon.

A sixteenth aspect of the seed crystal is a seed crystal according to the fifteenth aspect, wherein the high-purity silicon is single crystal silicon.

A seventeenth aspect of the seed crystal is a seed crystal according to the fifteenth aspect, wherein the high-purity silicon is polycrystalline silicon. An eighteenth aspect of the seed crystal is a seed crystal according to the twelfth aspect, wherein the pre-dipping heat conducting member is made of silicon, and the unconformity portion is a joint surface between silicon members.

A nineteenth aspect of the seed crystal is a seed crystal according to the eighteenth aspect, wherein the pre-dipping heat conducting member is made of high-purity silicon.

A twentieth aspect of the seed crystal is a seed crystal according to the nineteenth aspect, wherein the pre-dipping heat conducting member is made of single crystal silicon.

A twenty-first aspect of the seed crystal is a seed crystal according to the twentieth aspect, wherein the pre-dipping heat conducting member has a crystal orientation different from that of the seed for growing a single crystal.

A twenty-second aspect of the seed crystal is a seed crystal according to the twentieth aspect, wherein the pre-dipping heat conducting member has a crystal orientation which is the same as that of the seed for growing a single crystal.

A twenty-third aspect of the seed crystal is a seed crystal according to the nineteenth aspect, wherein the pre-dipping heat conducting member is made of polycrystalline silicon.

A twenty-fourth aspect of the seed crystal is a seed crystal according to the first aspect, wherein the unconformity portion is made of any one of an oxide film, a nitride film and a polycrystal film.

A twenty-fifth aspect of the seed crystal is a seed crystal according to the first aspect, wherein the unconformity portion is a contact surface-through which the seed for growing a single crystal and the pre-dipping heat conducting member are in direct contact with each other.

A twenty-sixth aspect of the seed crystal is a seed crystal according to the first aspect, wherein the unconformity portion is an impurity region formed by implanting ions.

A twenty-seventh aspect of the method of the present invention is a method of manufacturing a seed crystal for manufacturing a single crystal, which comprises: a step for preparing a seed for growing a single crystal; a step for preparing a pre-dipping heat conducting member arranged to be dipped in melt prior to dipping of the seed for growing a single crystal so as to conduct the heat of the melt to the seed for growing a single crystal; and a step for joining, to each other, the seed for growing a single crystal and the pre-dipping heat conducting member so as to contact each other face to face.

A twenty-eighth aspect of the method is a method according to the twenty-seventh aspect, wherein the joining step comprises a step for joining the seed for growing a single crystal and the pre-dipping heat conducting member to each other by heating; in an oxygen atmosphere, the seed for growing a single crystal and the pre-dipping heat conducting member which have been contacted with each other.

A twenty-ninth aspect of the method is a method according to the twenty-eighth aspect, wherein the joining step comprises a step for removing an oxide film exposed to the surface by etching the surface after heating the seed for growing a single crystal and the pre-dipping heat conducting member which have been contacted with each other in an oxygen atmosphere.

A thirtieth aspect of the method is a method of manufacturing a seed crystal for manufacturing a single crystal which comprises: a step for preparing a single crystal; a step for dividing the single crystal into two parts; and a joining step for joining the surfaces of the divided parts to each other by heating, in an oxygen atmosphere, the surfaces which have been contacted with each other.

A thirty-first aspect of the method is a method of manufacturing a seed crystal according to thirtieth aspect, further comprising: a step of forming an oxidation preventive film on the surface of the single-crystal prior to the dividing step; and a step of removing the oxidation preventive film after the joining step.

A thirty-second aspect of the method is a method of manufacturing a seed crystal according to thirty-first aspect, wherein the oxidation preventive film is made of silicon nitride.

A thirty-third aspect of the method is a method of manufacturing a seed crystal for manufacturing a single crystal according to thirty-first aspect, wherein the oxidation preventive film is made of resist.

A thirty-third aspect of the method is a method of manufacturing a seed crystal of the present invention, which comprises: a step for preparing a seed for growing a single crystal; a step for preparing a pre-dipping heat conducting member arranged to be dipped in melt prior to dipping of the seed for growing a single crystal so as to conduct the heat of the melt to the seed for growing a single crystal; a step for forming an oxide film on an end surface of at least either of the pre-dipping heat conducting member or the seed for growing a single crystal; and a joining step for joining the seed for growing a single crystal to the pre-dipping heat conducting member through the oxide film.

A thirty-fifth aspect of the method is a method of manufacturing a seed crystal according to thirty-fourth aspect, wherein the joining step is performed in a heated state.

A thirty-sixth aspect of the method is a method of manufacturing a seed crystal according to thirty-fourth aspect, further comprising a step of etching the surface of the seed for growing a single crystal.

A thirty-seventh aspect of the method is a method of manufacturing a seed crystal of the present invention, which comprises: a step for preparing a seed for growing a single crystal; a step for preparing a pre-dipping heat conducting member arranged to be dipped in the melt prior to dipping of the seed for growing a single crystal so as to conduct the heat of the melt to the seed for growing a single crystal; a step for forming a polycrystalline film on an end surface of at least either of the pre-dipping heat conducting member or the seed for growing a single crystal; and a joining step for joining the seed for growing a single crystal to the pre-dipping heat conducting member through the polycrystalline film.

A thirty-eighth aspect of the method is a method of manufacturing a seed crystal of the present invention, which comprises: a step for preparing a first plate made of single crystal silicon; a step for preparing a second plate made of single crystal silicon and having a silicon oxide film on at least a joint surface thereof; a step for forming a joined plate by joining the first and second plates to each other in a superimposed state by applying heat; and a step for forming a seed by cutting the joined plate along a surface perpendicular to the joint surface.

A thirty-ninth aspect of the method is a method of manufacturing a seed crystal according to thirty-eighth aspect, further comprising a step which is performed after the cutting step and in which the surface of the seed produced from the first plate is etched.

A fortieth aspect of the method is a method of manufacturing a seed crystal of the present invention, which comprises: a step for preparing a single crystal; and a step for forming an unconformity portion incorporating an impurity region by implanting ions of impurities to traverse a predetermined position of the single crystal.

A forty-first aspect of the method is a method of manufacturing a single crystal such that a single crystal is grown by dipping a seed.-crystal with which a single crystal is manufactured and which serves as a start for growth of a crystal into the surface of melt of a raw material and by raising the seed, said method of manufacturing a single crystal comprising: a step for bringing, into contact with the melt, a leading end of a seed crystal with which a single crystal is manufactured and which has an unconformity portion formed at a predetermined position apart from the leading end and structured to conduct the heat of the melt and interrupt propagation of dislocation caused from thermal stress produced when dipping in the melt has been performed; a step for continuing dipping of the seed crystal for manufacturing a single crystal in the melt until a position above the unconformity portion reaches the melt after contact of the leading end with the melt: and a growing step for growing the single crystal by pulling up the seed crystal for manufacturing a single crystal after the surface of the melt reaches the position above the unconformity portion.

A forty-second aspect of the method is a method of manufacturing a single crystal according to forty-first aspect, wherein the seed crystal for manufacturing a single crystal incorporates a seed for growing a single crystal and a pre-dipping heat conducting member arranged to be dipped into the melt prior to dipping of the seed for growing a single crystal, and the seed for growing a single crystal is dipped in the melt prior to completion of dissolution of the pre-dipping heat conducting member.

A forty-third aspect of the method is a method of manufacturing a single crystal according to forty-second aspect, wherein the pre-dipping heat conducting member is constituted by a cylindrical member having an engagement portion arranged to be engaged to the seed for growing a single crystal at a position of the side portion of the seed for growing a single crystal and covering the seed for growing a single crystal such that a constant distance is maintained, the leading end of the pre-dipping heat conducting member is structured to project over the leading end of the seed for growing a single crystal, and further comprises a step of pre-heating the leading end of the seed for growing a single crystal by enclosing the leading end of the seed for growing a single crystal by a pre-heating space formed by a portion of the pre-dipping heat conducting member above the surface of the melt and the surface of the melt so as to previously heat the leading end of the seed for growing a single crystal.

A forty-fourth aspect of the method is a method of manufacturing a single crystal according to forty-first aspect, wherein the seed crystal for manufacturing a single crystal is constituted by a seed for growing a single crystal and a pre-dipping heat conducting member arranged to be dipped into the melt prior to dipping of the seed for growing a single crystal, the seed for growing a single crystal has a lower end formed into a conical shape, the pre-dipping heat conducting member has an upper end formed to correspond to the conical shape, the seed for growing a single crystal and the pre-dipping heat conducting member are brought into intimate contact with each other through an unconformity portion for conducting the heat of the melt and interrupting propagation of dislocation caused from thermal stress produced when dipping in the melt has been performed, and the method further comprises a step of moving downwards the seed crystal until the surface of the melt reaches a position above the unconformity portion.

A forty-fifth aspect of the method is a method of manufacturing a single crystal according to forty-first aspect, wherein the seed crystal for manufacturing a single crystal incorporates a seed for growing a single crystal and a pre-dipping heat conducting member arranged to be dipped into the melt prior to dipping of the seed for growing a single crystal, the seed for growing a single crystal has a lower end inclined with respect to the surface of the melt, the pre-dipping heat conducting member has an upper end corresponding to the inclination, the seed for growing a single crystal and the pre-dipping heat conducting member are brought into intimate contact with each other through an unconformity portion structured to conduct the heat of melt and interrupt propagation of dislocation caused from thermal stress produced when dipping in the melt has been performed, and the method further comprises a step of moving downwards the seed crystal until the surface of the melt reaches a position above the unconformity portion.

A forty-sixth aspect of the method is a method of manufacturing a single crystal according to forty-first aspect, wherein the seed crystal for manufacturing a single crystal incorporates a seed for growing a single crystal and a pre-dipping heat conducting member arranged to be dipped into the melt prior to dipping of the seed for growing a single crystal, the seed for growing a single crystal has a lower end formed to be in parallel with the surface of the melt, the pre-dipping heat conducting member has an upper end corresponding to the parallel shape, the seed for growing a single crystal and the pre-dipping heat conducting member are brought into intimate contact with each other through an unconformity portion structured to conduct the heat of the melt and interrupt propagation of dislocation caused from thermal stress produced when dipping in the melt has been performed, and the method further comprises a step of moving downwards the seed crystal until the surface of the melt reaches a position above the unconformity portion.

A forty-seventh aspect of the method is a method of manufacturing a single crystal according to forty-first aspect, wherein the growing step further comprises a step of forming a shoulder portion of the single crystal, immediately sifted after dipping the seed for growing a single crystal in a non-dislocation state to the melt, without interposing a diameter reducing step for reducing the diameter of the crystal.

A forty-eighth aspect of the method is a method of manufacturing a single crystal according to forty-first aspect, wherein the seed crystal for manufacturing a single crystal is held by a seed holder which connects with a pulling up means through a heat insulating material.

According to first to third aspects of the present invention, the heat of the melt is conducted from a pre-heating member to the seed crystal for growing through the unconformity portion. Thus, the seed crystal for growing can be heated to a level near the temperature of the melt. Therefore, the thermal stress produced when immersion in the melt is performed can be reduced so that dislocation is prevented. Since the unconformity portion interrupts propagation of the dislocation, propagation of dislocation appearing in the pre-heating member to the seed crystal for growing can be prevented even if dislocation appears. Note that the pre-heating member is not required to be a single crystal if it is able to conduct the heat to the seed crystal for growing.

A fourth aspect of the present invention has the structure that the seed crystal for manufacturing a single crystal is formed by combining and integrating a seed for growing a single crystal and a pre-dipping heat conducting member, which is the pre-heating member, and which is arranged to be dipped in the melt prior to immersion of the seed for growing a single crystal and which conducts the heat of the melt to the seed for growing a single crystal. The foregoing structure is arranged such that the pre-dipping heat conducting member is dipped in the melt. Thus, the heat of the heated pre-dipping heat-conducting member is conducted to the seed for growing a single crystal disposed above the melt. Therefore, the seed for growing a single crystal is gradually heated. As a result, the seed for growing a single crystal can gently and sufficiently be heated as compared with a state in which a seed for growing a single crystal is solely allowed to stand still immediately above the melt. Although dislocation appears in the pre-dipping heat conducting member when the contact with the melt is performed if the pre-dipping heat conducting member is a crystal, propagation of the dislocation to the seed for growing a single crystal can be prevented.

According to a fifth aspect of the present invention, the distance is sufficiently elongated such that penetration of the melt by dint of the surface tension can be prevented. The reason for this lies in that penetration of the melt by dint of the surface tension and causing the seed for growing a single crystal to be brought into contact with the melt before the seed for growing a single crystal is sufficiently heated must be prevented. Thus, appearance of dislocation can be prevented.

Sixth to thirteenth aspects of the present invention are structured variously so that appearance of dislocation is further satisfactorily prevented.

According to a fourteenth aspect of the present invention, in addition to the foregoing effects, the unconformity portion is constituted by a silicon oxide film formed by oxidation of a contact portion realized after the pre-dipping heat conducting member and the seed for growing a single crystal have been brought into contact with each other. Therefore, the pre-dipping heat conducting member and the seed for growing a single crystal are secured to each other in a furthermore intimate contact state. Therefore, penetration of the melt into the gap by dint of the surface tension causing dislocation can be prevented.

According to the fifteenth to twenty-sixth aspects of the present invention structured variously are able to furthermore satisfactorily-prevent dislocation. In particular, the twenty-fifth aspect has the structure that the seed for growing a single crystal and the pre-dipping heat conducting member are directly in contact with each other. Therefore, the manufacturing process can easily be completed. Moreover, excellent heat contact can be realized at the interface. Moreover, propagation of the dislocation can satisfactorily be prevented. The twenty-sixth aspect has the structure that ion implantation is performed to form a region containing impurities. Thus, propagation of dislocation can be interrupted. Therefore, excellent heat contact can be realized at the interface similar to the twenty-fifth aspect. As a result, a seed crystal which permits a reliable single crystal to be grown can be obtained.

According to the twenty-seventh to fortieth aspects of the present invention, the seed crystal having a high quality, can be obtained.

Forty-first to forty-eighth aspects of the present invention have a structure that the seed crystal is used to raise the single crystal. After the surface of the melt has reached an upper portion of the unconformity portion, the single crystal is raised. Therefore, for example, the seed for growing a single crystal and pre-dipping heat-conducting member integrated with each other is dipped in the melt.

According to the foregoing structure, the difference between the temperature of the melt and that of the seed for growing a single crystal can be reduced before the seed for growing a single crystal is brought into contact with the melt. Moreover, the unconformity portion which is the interface between the pre-dipping heat conducting member and the seed for growing a single crystal interrupts propagation of dislocation from the pre-dipping heat conducting member to the seed for growing a single crystal.

In particular, the forty-second aspect of the present invention is characterized in that the seed for growing a single crystal is dipped in the melt during dissolution of the pre-dipping heat conducting member.

According to the foregoing structure, the heat is conducted from the melt to the seed for growing a single crystal through the pre-dipping heat conducting member. Then, the seed for growing a single crystal is dipped in the melt. Therefore, thermal stress produced in the seed for growing a single crystal can be reduced. Thus, dislocation can be prevented.

Forty-fifth to forty-sixth aspects of the present invention are characterized in that the pre-dipping heat conducting member is dipped in the melt in a state in which the pre-dipping heat conducting member is brought into contact with the lower portion of the seed for growing a single crystal so as to be integrated at the unconformity portion. Then, the pre-dipping heat conducting member is moved downwards while it is being dissolved. After the unconformity portion has been submerged in the melt, the growing crystal is raised under the lower portion of the seed for growing a single crystal.

According to the foregoing structure, the heat which is conducted from the melt to the pre-dipping heat conducting member because of immersion in the melt is directly conducted to the seed for growing a single crystal which is in contact with the pre-dipping heat conducting member at the unconformity portion. Therefore, the seed for growing a single crystal can gently and significantly be heated to a high level as compared with a state in which the seed for growing a single crystal is allowed to stand still immediately above the surface of the melt for a long time. When the unconformity portion has been submerged in the melt such that the above-mentioned state is maintained, the overall body of the pre-dipping heat conducting member and the lower portion of the seed for growing a single crystal are dissolved. Since only small thermal stress is produced in the seed for growing a single crystal and thus dislocation is not propagated, the crystal can directly be grown under the lower portion of the seed for growing a single crystal.

The method of manufacturing a single crystal according to the present invention may be structured such that the electric power loaded to the heater is operated when the pre-dipping heat conducting member is dissolved and the pre-dipping heat conducting member and the seed for growing a single crystal are dissolved.

That is, dissolution of the pre-dipping heat conducting member is started, and then the seed for growing a single crystal is dissolved. Since the electric power loaded to the heater is adjusted when the dissolution is performed, dissolution is performed smoothly. Moreover, conduction of the heat from the pre-dipping heat conducting member to the seed for growing a single crystal can satisfactorily be performed.

A forty-seventh aspect-of the present invention is characterized in that the seed for growing a single crystal in a non-dislocation state is dipped in the melt. Then, a process for forming the shoulder portion of the seed crystal is started.

According to the above-mentioned structure, the seed for growing a single crystal is previously heated until the difference in the temperature from that of the melt is very small. Since no dislocation appears by dint of dipping in the melt, the necessity of shifting the process of the necking step after immersion in the melt has been performed can be eliminated. That is, the step for forming the shoulder portion of the crystal can immediately be started. Therefore, the diameter of the seed for growing a single crystal is not reduced and thus a crystal is grown under the seed for growing a single crystal.

The unconformity portion is required to be in a crystal state or to have an unconformity composition. The unconformity portion includes both of a structure obtained by changing an integrated member by applying energy for causing unconformity and a structure obtained by joining individual members. That is, the unconformity portion may be either of an unconformity portion from a macroscopic viewpoint or an unconformity portion from a microscopic viewpoint. The unconformity portion is required to be capable of interrupting propagation of dislocation.

Other objects, features and advantages of the invention will be evident from the following detailed description of the preferred embodiments described in conjunction with the attached drawings.

BRIEF DESCRIPTION OF THE DRAWING

FIGS. 1A, 1B, 1C and 1D are perspective views showing a first embodiment of a seed crystal, in which FIG. 1A shows a seed for growing a single crystal, FIG. 1B shows a pre-dipping heat conducting member, FIG. 1C shows a state in which the seed for growing a single crystal and the pre-dipping heat conducting member are integrated with each other and FIG. 1D shows a seed crystal formed by integrating the two elements with each other;

FIGS. 2A, 2B and 2C are perspective views showing a second embodiment of a seed crystal, in which FIG. 2A shows a seed for growing a single crystal, FIG. 2B shows a pre-dipping heat conducting member and FIG. 2C shows a state in which the seed for growing a single crystal and the pre-dipping heat conducting member are integrated with each other;

FIGS. 3A, 3B and 3C are perspective views showing a third embodiment of a seed crystal, in which FIG. 3A shows a seed for growing a single crystal, FIG. 3B shows a pre-dipping heat conducting member and FIG. 3C shows a state in which the seed for growing a single crystal and the pre-dipping heat conducting member are integrated with each other;

FIGS. 4A, 4B and 4C are perspective views showing a fourth embodiment of a seed crystal, in which FIG. 4A shows a seed for growing a single crystal, FIG. 4B shows a pre-dipping heat conducting member and FIG. 4C shows a state in which the seed for growing a single crystal and the pre-dipping heat conducting member are integrated with each other;

FIGS. 5A, 5B, 5C and 5D are a diagram showing steps for manufacturing the seed crystal according to the first embodiment;

FIGS. 6A, 6B, 6C, 6D, 6E and 6F are a diagram showing a procedure for manufacturing a single crystal by using the seed crystal according to the first embodiment;

FIG. 7 is a graph showing temperatures of the seed for growing a single crystal and the pre-dipping heat conducting member and the distances from the surface of melt when a single crystal is manufactured by using the seed crystal according to the first embodiment;

DESCRIPTION OF THE PREFER EMBODIMENTS

Embodiments of a seed crystal for manufacturing a single crystal and a method of manufacturing the single crystal according to the present invention will now be described with reference to the drawings.

FIGS. 1A to 4C are perspective views showing first to fourth embodiments of the seed crystal for manufacturing a single crystal.

Figure 1A:
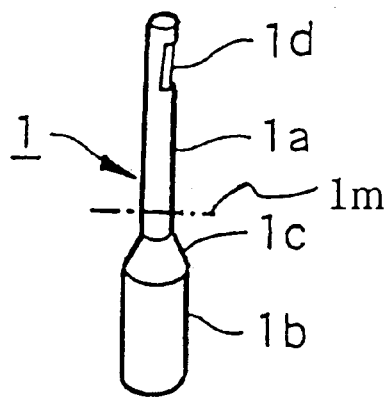
Figure 1B:
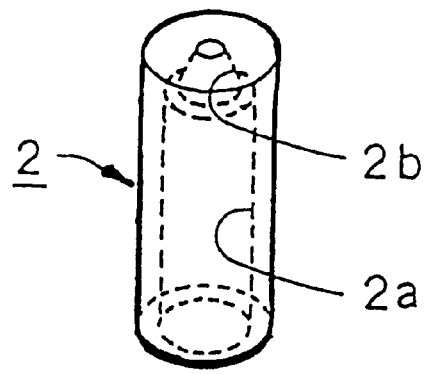
Figure 1C:
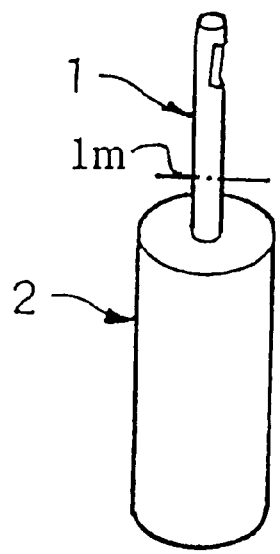

In the drawings, FIG. 1A shows a seed for growing a single crystal, FIG. 1B shows a pre-dipping heat conducting member and FIG. 1C shows a state in which the seed for growing a single crystal and the pre-dipping heat conducting member are integrated with each other (hereinafter the foregoing state is called a "seed crystal").

A seed 1 for growing a single crystal shown in FIG. 1A is constituted by connecting an upper portion 1$a$ having a diameter substantially the same as that of a usual seed and a lower portion 1$b$ having a diameter larger than that of the upper portion 1$a$, and a tapered portion 1$c$ connecting the upper and lower portions 1$a$ and 1$b$ to each other. An engagement portion 1$d$ for engagement with a seed holder is provided for the upper portion 1$a$. The upper portion 1$a$ has a growth start point 1$m$ to which melting is performed after which raising is performed.

A pre-dipping heat conducting member 2 shown in FIG. 1B comprises a cylindrical seed crystal including a large-diameter portion 2$a$ for accommodating the lower portion 1$b$ of the seed 1 for growing a single crystal and a tapered hole 2$b$ into which a tapered portion 1$c$ is inserted. When the seed 1 for growing a single crystal is inserted through the lower end of the large-diameter portion 2$a$, a seed crystal formed by integrating the two elements seed 1 and pre-dipping heat conducting member 2 as shown in FIG. 1C is obtained.

Figure 1D:
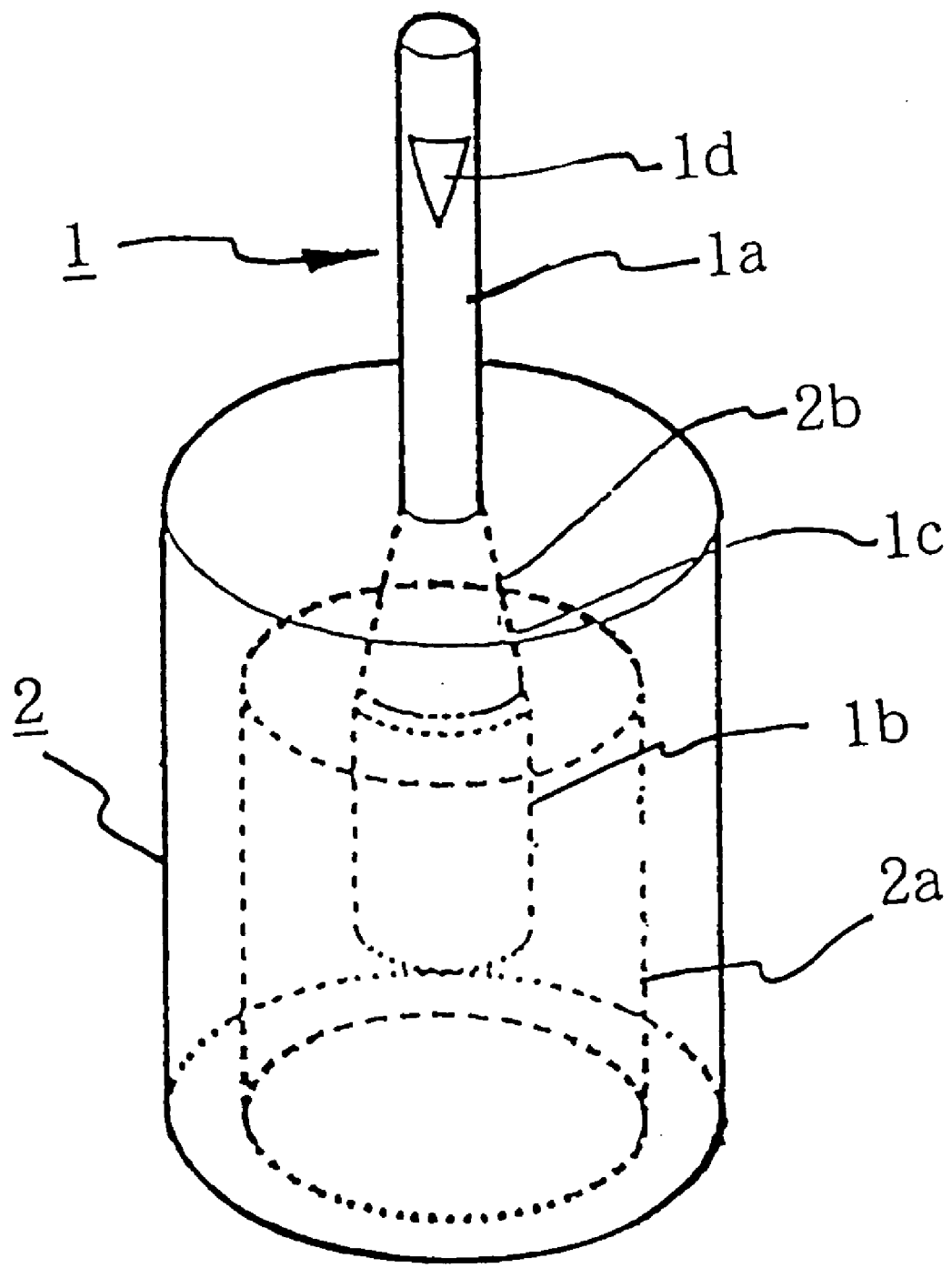

FIG. 1D is an overall schematic view showing the seed crystal. The seed 1 for growing a single crystal and the pre-dipping heat conducting member 2 are ground to have required shapes. Then, integral grinding is performed so that the tapered hole 2$b$ and the tapered portion 1c corresponding to the tapered hole 2$b$ are formed. Thus, the two elements are hermetically engaged to each other so that an engagement portion is formed which conducts the heat of the melt and interrupts propagation of dislocation caused from thermal stress produced when immersion in the melt is performed to the seed for growing a single crystal.

Figure 2A:
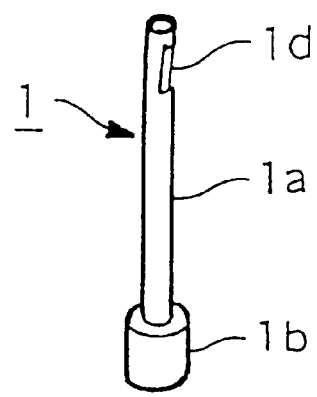
Figure 2B:
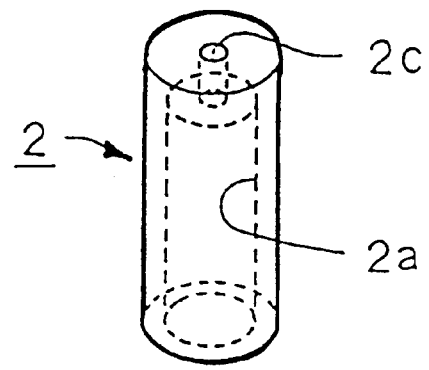
Figure 2C:
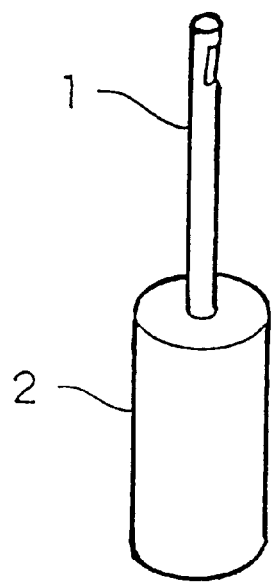

The above-mentioned seed crystal is used to raise a single crystal. The seed crystal is not limited to the foregoing shape and arbitrary change is permitted. Each of FIGS. 2A–2C shows a shape of the engagement portion formed into a portion having the same diameter changed from the tapered shape. The other portions are the same as those of the engagement portion according to the first embodiment. A seed 1 for growing a single crystal shown in FIG. 2A is constituted by connecting an upper portion 1$a$ having a diameter substantially the same as that of a usual seed and a lower portion 1$b$ having a diameter larger than that of the upper portion 1$a$ to each other. An engagement portion 1$d$ for engagement with a seed holder is provided for the upper portion 1$a$. A pre-dipping heat conducting member 2 shown in FIG. 2B has a cylindrical seed crystal which includes a small-diameter hole 2$c$, into which an upper portion 1$a$ of a seed 1 for growing a single crystal is inserted, and a large-diameter portion 2a for accommodating a lower portion 1b. When the seed 1 for growing a single crystal is inserted into the lower end of the large-diameter portion 2a, a seed crystal constituted by integrating the two elements as shown in FIG. 2C is obtained.

Figure 3A:
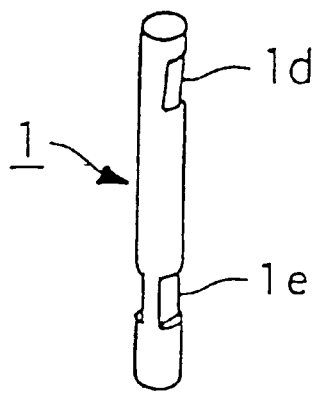
Figure 3B:
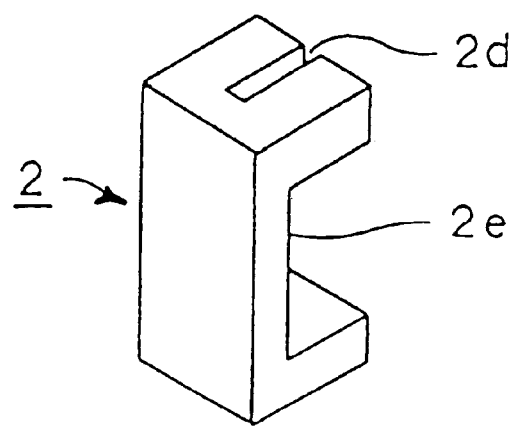
Figure 3C:
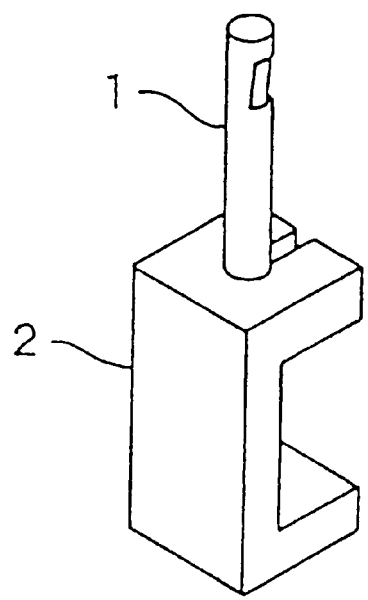

The engagement portion may have a groove provided in place of the hole. A seed 1 for growing a single crystal shown in FIG. 3A has cut portions 1e formed in the two side surfaces of a seed crystal having a diameter which is substantially the same as that of a usual seed crystal. Moreover, an engagement portion 1d for engaging the seed holder is formed in the upper end portion of the seed crystal. A pre-dipping heat conducting member 2 shown in FIG. 3B has a prism-shape seed crystal which has an upper surface provided with a cut groove 2d arranged to be engaged to a cut portion 1e of a seed 1 for growing a single crystal. A cut groove 2d into which a lower portion of the seed 1 for growing a single crystal is inserted is provided for the side surface of the seed crystal. When the seed 1 for growing a single crystal is inserted into the side surface of the pre-dipping heat conducting member 2, a seed crystal constituted by integrating the two elements as shown in FIG. 3C is obtained.

Figure 4A:
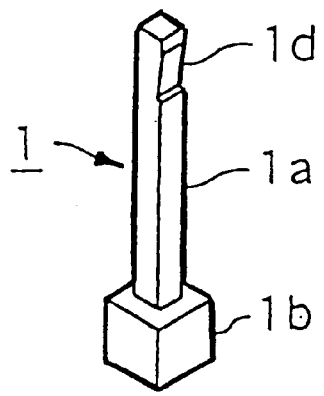
Figure 4B:
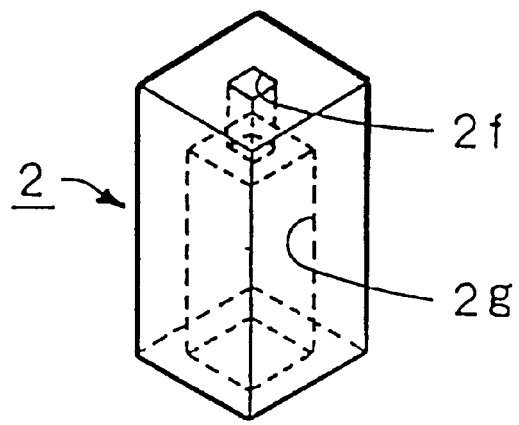
Figure 4C:
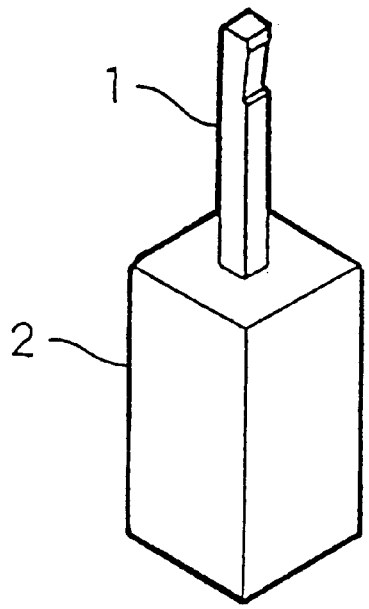

A prism-shape pre-dipping heat conducting member is an advantageous structure. A seed 1 for growing a single crystal shown in FIG. 4A is constituted by connecting a prism-shape upper portion 1a having a diameter which is substantially the same as that of a usual seed crystal and a prism-shape lower portion 1b which is larger than the upper portion 1a to each other. The upper portion 1a is provided with an engagement portion 1d with which engagement to a seed holder is made. A pre-dipping heat conducting member 2 shown in FIG. 4B incorporates a prism-shape crystal which includes a rectangular hole 2f into which an upper portion 1a of a seed 1 for growing a single crystal is inserted and a rectangular hole 2g for accommodating a lower portion 1b. When the seed 1 for growing a single crystal is inserted into the lower end of the rectangular hole 2g, a seed crystal formed by combining the two elements with each other as shown in FIG. 4C is obtained.

The seed 1 for growing a single crystal and the pre-dipping heat conducting member 2 are obtained by machining an ingot of a single crystal silicon into a predetermined shape. Then, chemical polishing or etching for removing distortion caused from machining is performed.

Since buoyant force of the melt causes upward force to act on the pre-dipping heat conducting member 2, separation easily takes place. If a gap is formed, surface tension causes the melt to penetrate upward. In this case, the melt is brought into contact with the seed for growing a single crystal which has not sufficiently been pre-heated, causing dislocation to appear. Therefore, it is preferable that the intimate contact of the joint portion is maintained. To realize the intimate contact, it is preferable that a silicon oxide film 10 for intimately joining the seed for growing a single crystal and the pre-dipping heat conducting member to each other is formed.

An example of a method of manufacturing the seed crystal will now be described. As shown in FIG. 5A, the seed 1 for growing a single crystal and the pre-dipping heat conducting member 2 are machined into predetermined shapes by grinding a single crystal silicon.

As shown in FIG. 5B, integral grinding is performed so that the tapered portion 1e of the seed 1 for growing a single crystal is joined to the inside portion k of the tapered hole.

Reference numeral 1m represents a position at which growth of a crystal is started, that is, a growth point. In the foregoing state, heating to about 500° C. is performed in an oxidation atmosphere. Thus, a silicon oxide film 10 is formed in a gap between the joint surfaces, as shown in FIG. 5C. At this time, also a silicon oxide film 10 is formed on the surface of each of the seed 1 for growing a single crystal and the pre-dipping heat conducting member 2. Only a region below the joint portion is dipped in etching solution composed of dilute hydrofluoric acid so that a seed crystal having a clean surface as shown in FIG. 5D is obtained.

The shapes of the seed for growing a single crystal and the pre-dipping heat conducting member are not limited to those shown in FIGS. 1A to 4C. Other shapes may be employed if the pre-dipping heat conducting member is dipped in the melt before the seed for growing a single crystal is dipped in the melt. Examples of the foregoing structure are shown in FIGS. 9 to 12 and 17.

A procedure for manufacturing a single crystal by using the seed crystal shown in FIG. 1C will now be described. As shown in FIGS. 5A to 5D which shows the manufacturing steps, each of the seed crystal is obtained such that the seed for growing a single crystal and the pre-dipping heat conducting member 2 is ground so that required shapes are formed. Then, integral grinding is performed so that the tapered hole 2b and the tapered portion 1c corresponding to the tapered hole 2b are formed. Then, the two elements are intimately joined to each other through the silicon oxide film 10. FIG. 7 shows results of measurements of the relationship between temperatures at positions a and b of the seed 1 for growing a single crystal and the pre-dipping heat conducting member 2 and distances d from the surface of the melt. To make a comparison, the relationship between the distances from the surface of the melt and temperatures is indicated with a curve c.

The measuring position is a point apart from the leading end for substantially the same distance as the positions a and b.

After the polycrystal raw material enclosed in the quartz crucible has completely been dissolved, the melt 3 is maintained at an adequate temperature. As shown in FIG. 6A, the seed crystal composed of the seed 1 for growing a single crystal joined to a seed holder (not shown) disposed at the lower end of a raising shaft 4 and the pre-dipping heat conducting member 2 is moved downwards (step S1). Thus, the pre-dipping heat conducting member 2 is initially brought into contact with the surface of the melt (see FIG. 6B: step S2). When the downward movement is continued at predetermined speed, the pre-dipping heat conducting member 2 is dissolved starting at the lower end (step S3). At this time, the temperature of the melt at which the portion dipped in the melt can always and continuously be dissolved is maintained by adjusting electric power while a state of dissolution of the pre-dipping heat conducting member 2 is being observed.

During the foregoing period of time, the temperature of the melt 3 is conducted from the pre-dipping heat conducting member 2 to the seed 1 for growing a single crystal by dint of dissolution of the pre-dipping heat conducting member 2. Also as can be understood from the curve shown in FIG. 7, the temperature of the seed 1 for growing a single crystal is changed similarly to the temperature of the pre-dipping heat conducting member 2. Therefore, the temperature is considerably raised as compared with a state in which the seed 1 for growing a single crystal is solely closed to the surface of the melt 3. Thus, the difference between the temperature of the melt 3 and that of the seed 1 for growing a single crystal is significantly reduced.

When the downward movement is continued, the lower surface of the seed 1 for growing a single crystal reaches the surface of the melt, as shown in FIG. 6D (step S4). At this time, the heat has sufficiently been conducted to the seed 1 for growing a single crystal from the pre-dipping heat conducting member 2. Therefore, even if the seed 1 for growing a single crystal is dipped in the melt 3, any dislocation does not take place. The foregoing fact can be understood from a comparison between curves a and c shown in FIG. 7 because change in the temperature of the seed for growing a single crystal occurring when the contact with the melt has been performed has considerably been reduced.

Figure 8:
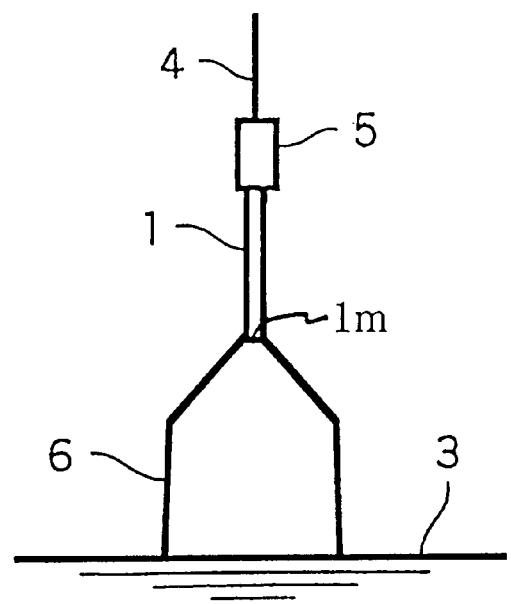
FIG. 8 is a diagram showing a procedure for manufacturing a single crystal by using the seed crystal according to the first embodiment such that a state in which the single crystal is being grown is illustrated.

At the above-mentioned position, both of the pre-dipping heat conducting member 2 and the seed 1 for growing a single crystal have been dipped in the melt 3. Therefore, the upper portion of the pre-dipping heat-conducting member 2 is not dissolved and allowed to remain. As a result, smooth raising of the seed crystal is sometimes obstructed. Therefore, as shown in FIG. 6E, the downward movement of the seed crystal is continued while the lower portion 1b of the seed 1 for growing a single crystal is being melted. As shown in FIG. 6F, the pre-dipping heat conducting member 2 and a portion of the seed 1 for growing a single crystal below the tapered portion 1c are dipped in the melt 3 so as to be melted. As a result, only the upper portion 1a of the seed 1 for growing a single crystal is not melted and allowed to remain. To prevent popping out of the seed 1 for growing a single crystal and realize an adequate temperature for starting the operation for raising the seed crystal, the temperature of the melt is adjusted. Thus, as shown in FIG. 8, raising of the seed crystal 6 is started. Since the seed 1 for growing a single crystal is free from dislocation, the necessity of performing a necking step can be eliminated.

Therefore, the process is immediately shifted to a step for forming a shoulder portion. Then, the seed crystal 6 is grown similar to a usual process. The single crystal is supported by the seed holder 5. The portion of the seed holder with which the contact with the seed crystal is established is made of a heat insulating material. Thus, radiation of heat can be prevented. Therefore, the heat from the pre-dipping heat conducting member can efficiently be used to heat the seed for growing a single crystal.

The present invention was applied such that a seed crystal having a diameter of 12.7 mm was used as the seed for growing a single crystal and eight inch diameter silicon single crystals, the weight of each of which was 200 kg, were raised. The seed for growing a single crystal was free from dislocation of the crystal. When a seed crystal having a diameter of 12.7 mm is used, setting of the withstand load to be 12.5 kg/mm$^2$, enables a load not smaller than 1 ton to be supported. If a silicon single crystal having a diameter of 310 mm is used, a silicon single crystal having a length of 1500 mm can easily be raised.

The pre-dipping heat conducting member has an engagement portion which is an unconformity portion arranged to be engaged to the seed for growing a single crystal at a position higher than the seed for growing a single crystal. Thus, the engagement portion conducts heat of the melt and interrupts propagation of dislocation caused from thermal stress when dipping in the melt is performed to the seed for growing a single crystal. Moreover, the pre-dipping heat conducting member covers the seed for growing a single crystal such that a predetermined distance is maintained between the seed for growing a single crystal and the pre-dipping heat conducting member. The leading end of the pre-dipping heat conducting member projects over the leading end of the seed for growing a single crystal.

Therefore, the leading end of the seed for growing a single crystal is covered with the pre-dipping heat conducting member from a moment of time at which the leading end of the pre-dipping heat conducting member has been brought into contact with the melt as shown in FIG. 6B. Thus, the leading end is kept in a space heated with the heat of the melt. Thus, in a state in which the heat is applied from the leading end of the pre-dipping heat conducting member, the seed for growing a single crystal approaches the surface of the melt. Therefore, change in the heat occurring at the instant when the leading end of the seed for growing a single crystal has been brought into contact with the melt can significantly be reduced as shown in FIG. 6D.

Figure 9:
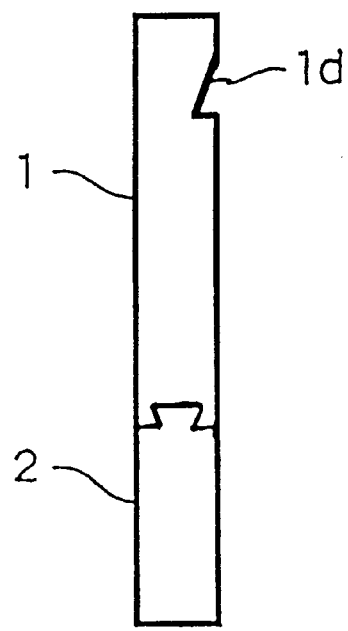
FIG. 9 is a front view showing a fifth embodiment of the seed crystal.

A fifth embodiment of the present invention is shown in FIG. 9. In the first to fourth embodiments, the pre-dipping seed covers the seed for growing a single crystal. A structure that the pre-dipping seed is joined to the leading end of the seed for growing a single crystal is an effective structure. The seed crystal is, as shown in FIG. 9, formed by connecting a cylindrical or prism-shape seed 1 for growing a single crystal and a pre-dipping heat conducting member 2 to each other by dovetail joint. In this embodiment, the dovetail joint surface constitutes the unconformity portion for interrupting propagation of dislocation. The pre-dipping heat conducting member 2 below the dovetail surface is first dipped in the melt. Thus, the pre-dipping heat conducting member 2 conducts the heat of the melt while the pre-dipping heat-conducting member 2 is being melted.

Thus, the seed for growing a single crystal is previously heated. The dislocation appear in the pre-dipping heat conducting member 2 is not propagated to the seed 1 for growing a single crystal. When the temperature of the seed for growing a single crystal has been raised to a level near the temperature of the melt, the seed 1 for growing a single crystal is dipped in the melt. At this time, the pre-dipping heat conducting member 2 has completely been melted.

Also in this case, a silicon oxide film is formed between the joint surfaces of the pre-dipping heat conducting member 2 and the seed 1 for growing a single crystal. Thus, a reliable seed crystal can be obtained with which the effect of interrupting propagation of dislocation can be made to be further reliable and which is able to prevent penetration of the melt into the gap by dint of surface tension. Although the above-mentioned embodiments have the structure that the pre-dipping heat conducting member 2 and the seed 1 for growing a single crystal manufactured individually are joined to each other to form the seed crystal, the present invention is not limited to this. The seed crystal is required to have an unconformity portion formed at a predetermined position apart from the leading end and to be capable of conducting the heat of the melt and interrupting propagation of dislocation appearing by dint of thermal stress caused when dipping in the melt has been performed. The unconformity portion may be a silicon oxide film or a silicon nitride film.

The unconformity portion may be joint surfaces between silicones. As a matter of course, the pre-dipping heat conducting member is not required to always be a single crystal.

Figure 10:
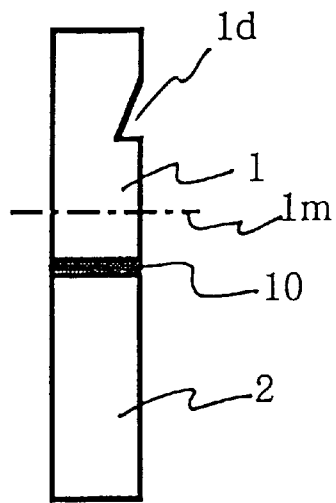
FIG. 10 is a front view showing a modification of the seed crystal.
Figure 11:
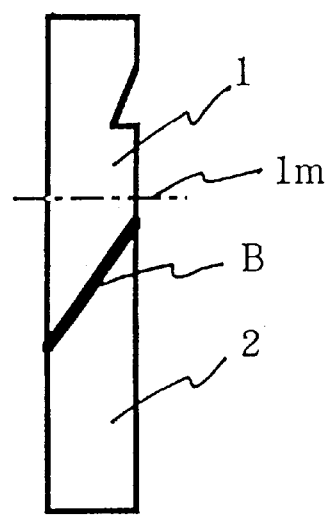
FIG. 11 is front view showing a modification of the seed crystal.

Although the foregoing embodiments employing the dovetail joint have been described, a structure having an unconformity portion which is in parallel with the surface of the melt as shown in FIG. 10 may be employed. In this case, a pre-dipping heat conducting member 2 made of a polycrystalline silicon is joined to the lower end of the seed 1 for growing a single crystal made of a single crystal through a silicon oxide film 10. A structure having an unconformity portion B formed diagonally as shown in FIG. 11 enables the area of joining to be enlarged and a seed crystal exhibiting a large union force to be obtained.

Figure 12:
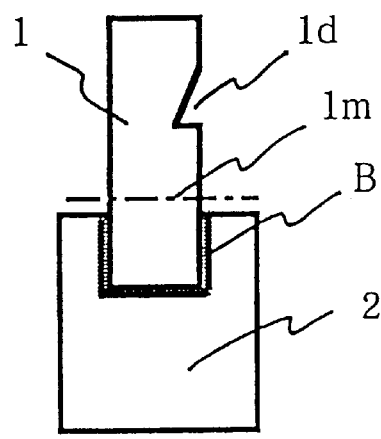
FIG. 12 is a front view showing a modification of the seed crystal.
Figure 17:
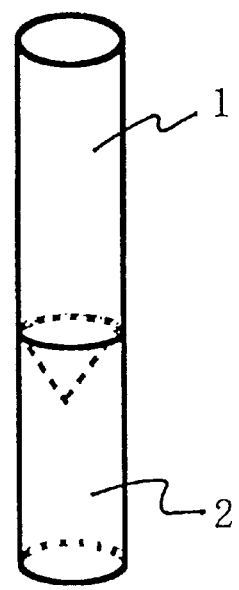
FIG. 17 is a perspective view showing a modification of the seed crystal according to the present invention.

A structure shown in FIG. 12 has a recess formed in the upper surface of a pre-dipping heat conducting member 2. A single crystal silicon rod which is the seed 1 for growing a single crystal is inserted into the recess so as to be joined. The interface between the seed 1 for growing a single crystal and the pre-dipping heat conducting member 2 constitute the unconformity portion B. It is preferable that a silicon oxide film is formed also on the foregoing interface to realize a strong joint.

Figure 13A:
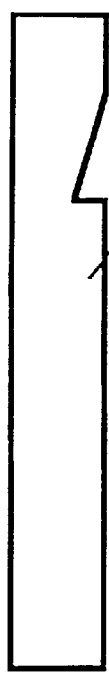
FIGS. 13A, 13B, 13C, 13D and 13E are diagrams showing a method of manufacturing a seed crystal according to a sixth embodiment of the present invention.
Figure 13B:
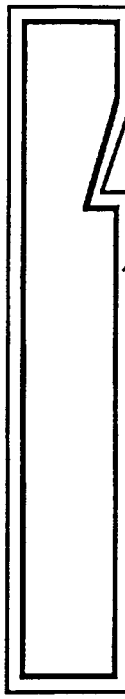
Figure 13C:
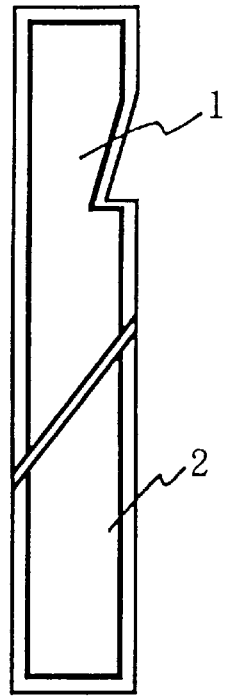
Figure 13D:
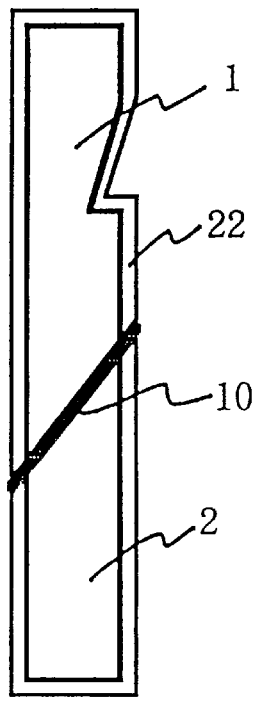
Figure 13E:
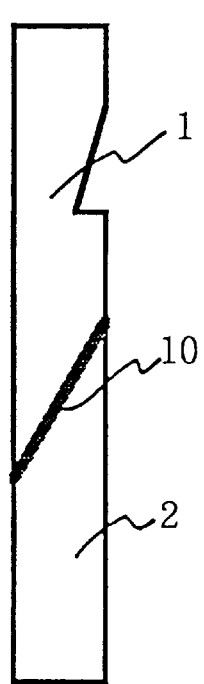

A method of forming a seed crystal according to a sixth embodiment of the present invention will now be described. In this embodiment, a single crystal silicon 21 is machined to have a required shape, as shown in FIG. 13A. As shown in FIG. 13B, a silicon nitride film is formed as an oxidation preventive film 22. Then, the single crystal silicon 21 is parted as shown in FIG. 13C. The parted surfaces of the parted single crystal silicon are joined to each other, and then heated in an oxygen atmosphere. Then, a silicon oxide film 10 is formed as shown in FIG. 13D. Then, the oxidation preventive film is removed by etching so that a seed crystal joined through the silicon oxide film 10 as shown in FIG. 13E is obtained.

Figure 14A:
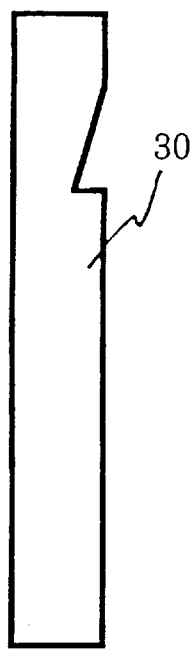
FIGS. 14A and 14B are diagrams showing a method of manufacturing a seed crystal according to a seventh embodiment of the present invention.
Figure 14B:
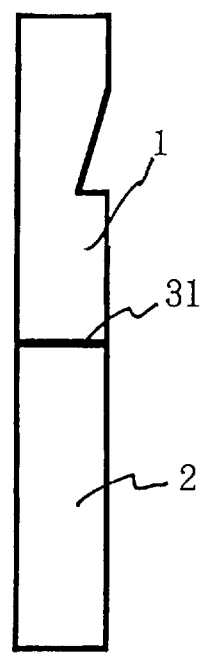

A seventh embodiment of the present invention will now be described in which ion implantation is performed to form the unconformity portion. Initially, single crystal silicon is machined to have a required shape as shown in FIG. 14A so that a base member 30 is formed. As shown in FIG. 14B, oxygen ions are implanted to a required position of the base member so that a silicon oxide layer 31 is formed.

Figure 15A:
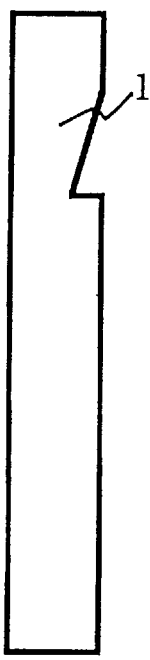
FIGS. 15A, 15B and 15C are diagrams showing a method of manufacturing a seed crystal according to an eighth embodiment of the present invention.
Figure 15B:
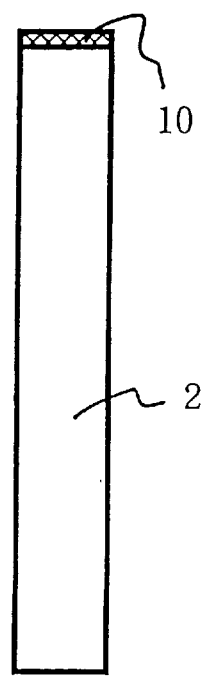

The foregoing method enables a discontinuous structure to physically be realized by the ion-implanted layer without mechanical parting. Therefore, separation at the interface and undesirable introduction of the melt into a gap can be prevented. An eighth embodiment of the present invention will now be described in which the seed crystal is formed by joining. As shown in FIGS. 15A and 15B, a single crystal silicon is machined to have a required shape so that a seed 1 for growing a single crystal and a pre-dipping heat conducting member 2 are formed. A silicon oxide film 10 is previously formed on the joint surface of the pre-dipping heat conducting member 2.

Figure 15C:
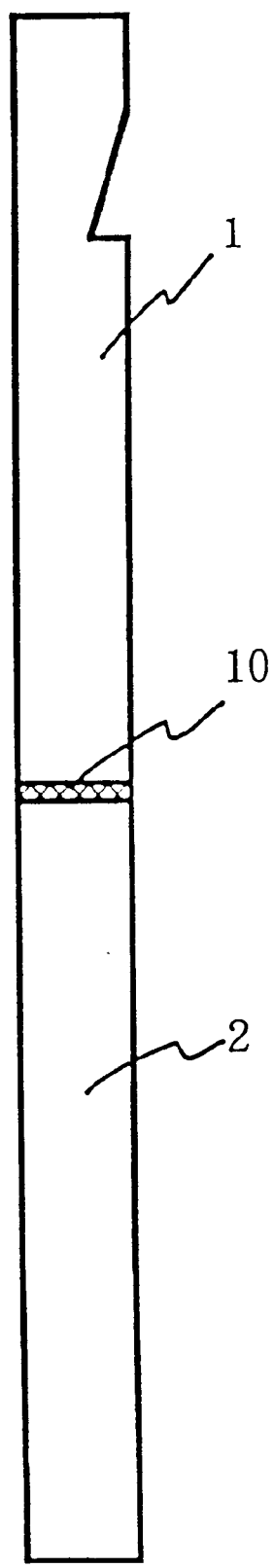

In the foregoing state, the seed 1 for growing a single crystal and the pre-dipping heat conducting member 2 are joined to each other through the silicon oxide film 10, as shown in FIG. 15C.

The foregoing method enables a strong joint to be realized. Any penetration of the melt into the interface can be prevented. Thus, a reliable raising operation can be performed.

A ninth embodiment of the present invention will now be described.

In this embodiment, two plates are joined to each other by bonding through a silicon oxide film, after which cutting is performed so that a seed crystal is formed.

Figure 16A:
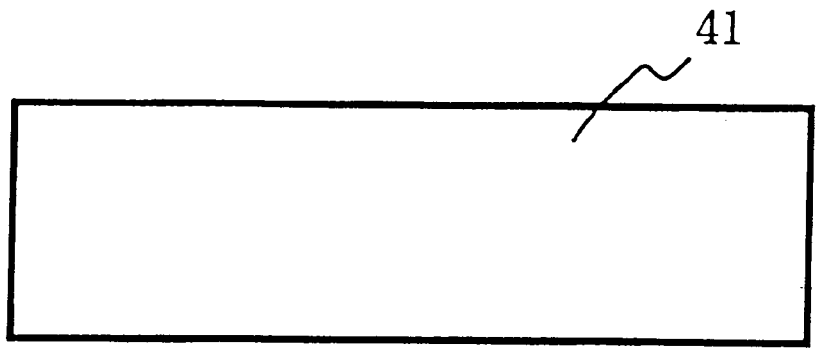
FIGS. 16A, 16B, 16C and 16D are diagrams showing a method of manufacturing a seed crystal according to a ninth embodiment of the present invention.
Figure 16B:
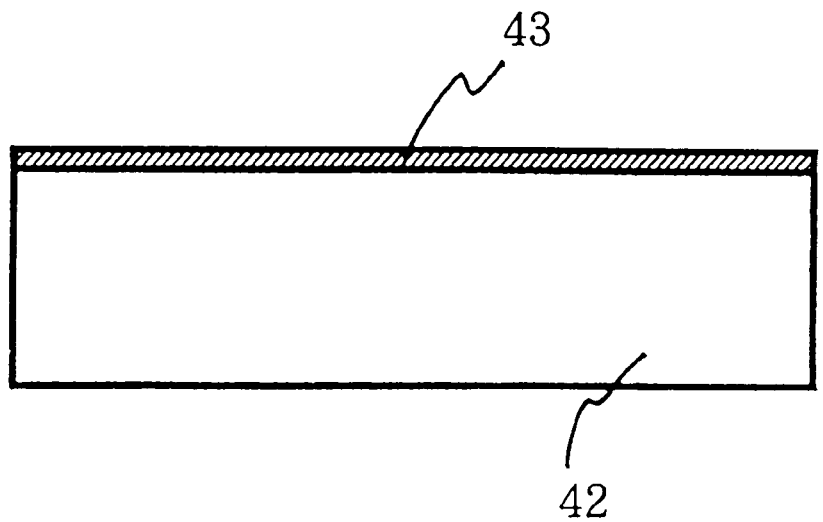

Initially, a first plate 41 made of single crystal silicon as shown in FIG. 16A is prepared. Moreover, a second plate 42 made of single crystal silicon and having a silicon oxide film 43 formed on the joint surface thereof as shown in FIG. 16B is prepared.

Figure 16C:
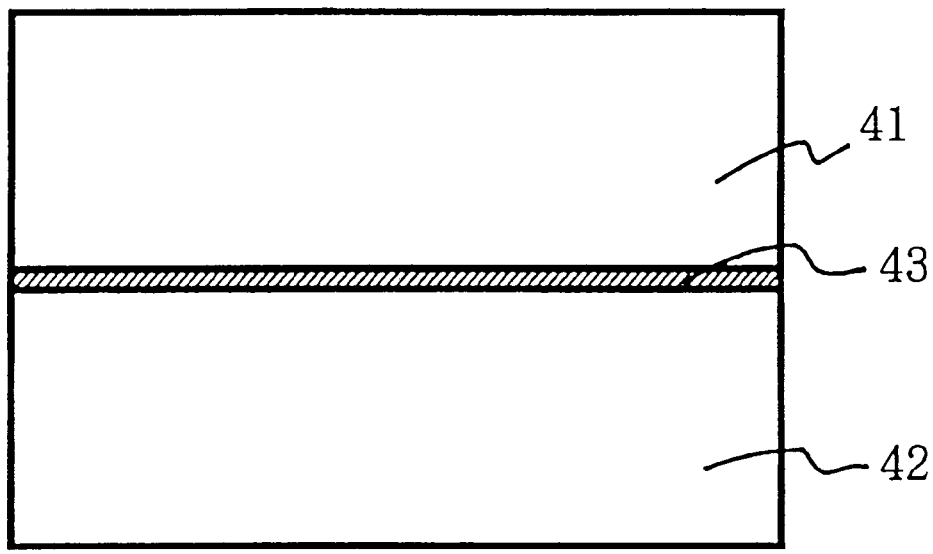

As shown in FIG. 16C, the first and second plates superimposed through the silicon oxide film 43 are heated so as to be joined to each other. Thus, a joined plate is formed.

Figure 16D:
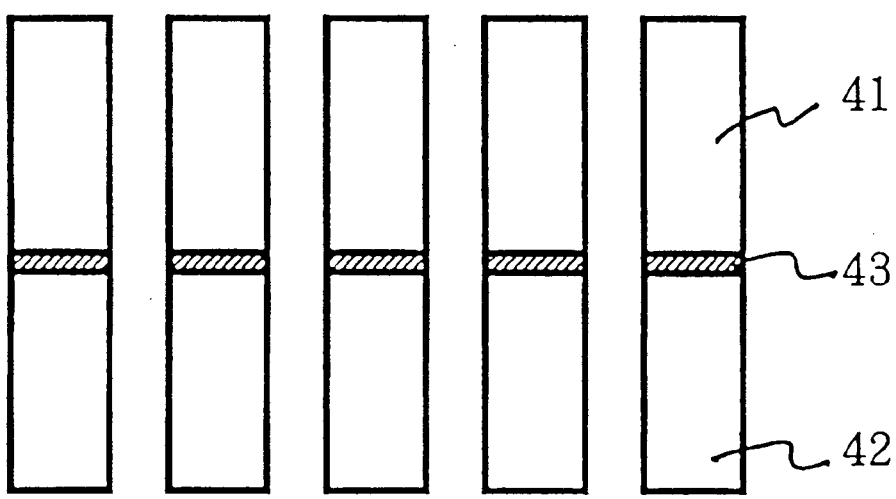
Figure 18:
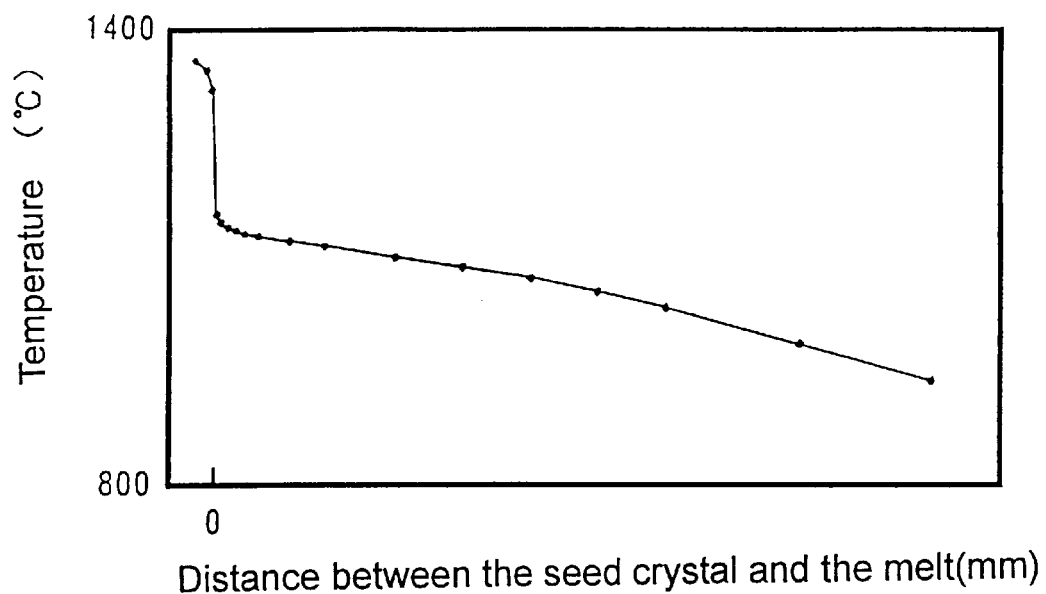
FIG. 18 is a graph showing change in the temperature at the leading end of the seed crystal when the seed crystal has gradually been moved close to the melt.
Figure 19:
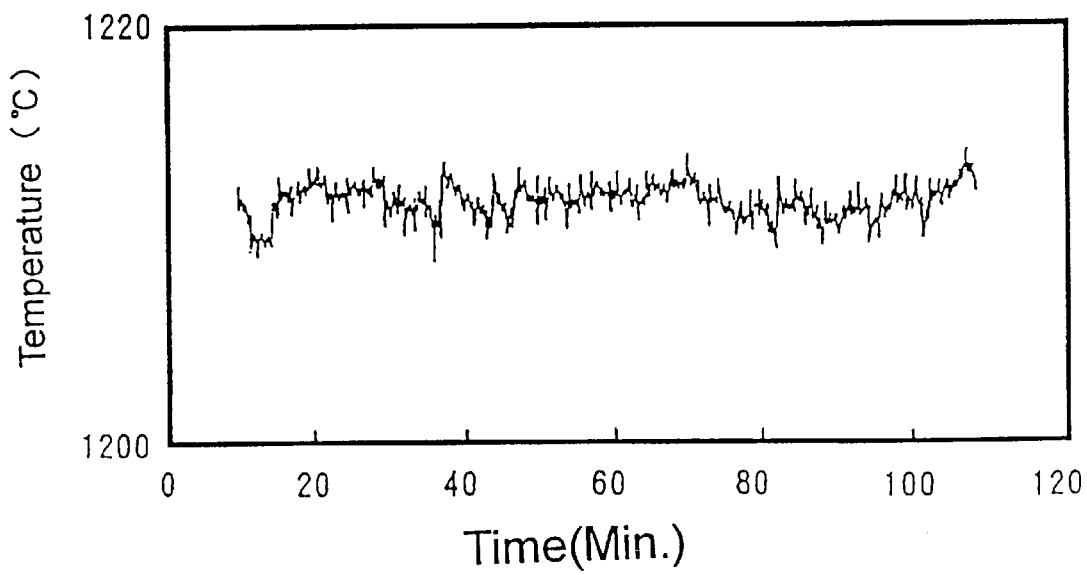
FIG. 19 is a graph showing change in the temperature at the leading end of the seed crystal as the time elapses when the leading end of the seed crystal has been fixed to a distance of 2.7 mm from the surface of the melt.

As shown in FIG. 16D, the joined plate is cut along a surface perpendicular to the joined surface to have a required shape. Thus, a multiplicity of seeds are formed. It is preferable that the surface of the seed crystal adjacent to the first plate is etched after the cutting step has been performed.

Thus, seed crystals each having the unconformity portion can easily be formed with satisfactory workability.

When a material containing polycrystalline silicon layer doped at a high concentration is used in the vicinity of the joint surface with the seed for growing a single crystal, the silicon oxide film can easily be formed in the oxidizing step. Thus, easy joint is permitted. It is preferable that the silicon oxide film is formed such that joining can be strengthened. As a matter of course, the silicon oxide film may simply plug the gap.

The seed for growing a single crystal may have a leading end formed into a conical shape. The pre-dipping heat conducting member has an engagement portion which is the unconformity portion arranged to be engaged to the conical portion so as to conduct the heat of the melt to the seed for growing a single crystal. Moreover, the unconformity portion interrupts dislocation appearing by the thermal stress when dipping in the melt has been performed. In addition, the two elements are intimately joined to each other through a silicon oxide film. Also the foregoing structure is an advantageous structure.

The foregoing embodiments have been described about the structure using silicon. As a matter of course, the present invention may be applied to a process of raising a compound semiconductor, such as GaAs, GaAsP or InP. Also in the case of the compound semiconductor, an oxide film is formed on the interface so that effects similar to those obtainable from the foregoing embodiments can be obtained.

As described above, the present invention enables the following effects to be obtained.

(1) The seed for growing a single crystal is applied with the heat of the melt conducted from the pre-dipping heat conducting member. As a result, the seed for growing a single crystal is heated to a temperature near the temperature of the melt before the seed 1 for growing a single crystal is dipped in the melt. As a result, the difference in the temperature between the two elements can be reduced. Even if dislocation appears in the pre-dipping heat conducting member, the unconformity portion interrupts propagation of the dislocation. Therefore, thermal stress which is caused when contacting the melt can be reduced. In addition, the dislocation is not propagated.

As a result, drawing using the Dash neck method is not required. Moreover, reduction in the diameter of the seed for growing a single crystal is not required and the process can immediately be shifted to the step for forming the shoulder portion. Since the necking step can be omitted, the producibility can be improved.

(2) Since the conventional method of suspending the single crystal by the neck portion is not employed, a heavy seed crystal can be manufactured without any risk of breaking the neck portion.

(3) The seed holder and the apparatus for manufacturing the single crystal are not required to be provided with special heating means. Thus, structure of the apparatus for manufacturing the single crystal can be simplified.

(4) The pre-dipping heat conducting member is melted in the melt and eliminated so as to be a part of the melt. Therefore, the pre-dipping heat conducting member does not obstruct the growth of the single crystal. Moreover, the pre-dipping heat conducting member may have an arbitrary length. When a sufficiently long length is provided and the downward movement is performed gradually, gentle preparation of raising can be performed without rapid change in the temperature of the leading end of the seed for growing a single crystal. As a result, the crystallinity can furthermore be improved.

(5) Growth-surface( pulling-up starting point) is not an interface between the pre-dipping heat conducting member and the seed for growing a single crystal, and within the seed for growing a single crystal. Since the leading end of the seed for growing a single crystal is dipped into the melt and molten sufficiently and then crystal growth is started from the starting surface which has a stable and good crystalline characteristics, dislocation is rarely caused.

(6) Since the pre-dipping heat conducting member and the seed for growing a single crystal can be joined to each other without an adhesive agent or a special joining jig, joining to the holder can be performed similarly to a usual seed crystal. Moreover, contamination of the melt can be prevented by a conventional means.

Although the invention has been described in its preferred form and structure with a certain degree of particularity, it is understood that the present disclosure of the preferred form can be changed in the details of construction and in the combination and arrangement of parts without departing from the spirit and the scope of the invention as hereinafter claimed.

What is claimed is:

1. A seed crystal for manufacturing a single crystal comprising:
   an unconformity portion formed at a position apart from a leading end of the seed crystal;
   wherein the unconformity portion is structured to conduct heat of a melt and interrupt propagation of dislocation caused from thermal stress produced when dipping in the melt has been performed, and wherein the seed crystal is entirely made of a material that can be dissolved into the melt.

2. A seed crystal for manufacturing a single crystal comprising:
   a seed for growing a single crystal; and
   a pre-dipping heat conducting member which is arranged to be dipped in a melt prior to dipping of the seed so as to conduct heat of the melt to the seed, wherein the pre-dipping heat conducting member is made of the same material as the seed;
   wherein the seed and the pre-dipping heat conducting member are joined to each other through the unconformity portion formed so as to conduct the heat of the melt from the pre-dipping heat conducting member to the seed and interrupt propagation of dislocation caused from thermal stress produced when dipping in the melt has been performed.

3. The seed crystal according to claim 2, wherein the pre-dipping heat conducting member is, through the unconformity portion, joined to a first position below a second position at which growing of the seed is started.

4. The seed crystal according to claim 2, wherein the pre-dipping heat conducting member is formed to have an engagement portion arranged to be engaged to the seed at a position of a side portion of the seed and surround the seed such that a constant distance is maintained between an inner surface of the pre-dipping heat conducting member and the seed below the engagement portion, and wherein the leading end of the pre-dipped heat conducting member is formed to project over leading end of the seed.

5. The seed crystal according to claim 4, wherein the constant distance is sufficiently large such that penetration of the melt caused from surface tension can be prevented.

6. The seed crystal according to claim 5, wherein the seed has a large-diameter portion and a small-diameter portion continuously formed on the large-diameter portion, and wherein the pre-dipping heat conducting member is constituted by a cylinder having a hole through which the small-diameter portion can be inserted and at which the large-diameter portion is engaged.

7. The seed crystal according to claim 6, wherein the hole is formed into a tapered shape.

8. The seed crystal according to claim 2, wherein the unconformity portion is formed at a lower end of the seed and has a joining surface in the form of a dovetail joint.

9. The seed crystal for manufacturing a single crystal according to claim 2, wherein the unconformity portion is positioned at a lower end of the seed and formed to be in parallel with the surface of the melt.

10. The seed crystal according to claim 2, wherein the unconformity portion is positioned at a lower end of the seed and arranged to form a surface inclined with respect to the surface of the melt.

11. The seed crystal according to claim 2, wherein the unconformity portion is positioned at a lower end of the seed and arranged to form a conical side surface.

12. The seed crystal according to claim 2, wherein the seed is made of silicon.

13. The seed crystal according to claim 12, wherein the pre-dipping heat conducting member is made of silicon, wherein the pre-dipping heat conducting member is connected to the seed through the unconformity portion comprising any one of a silicon oxide film, a silicon nitride film and a polycrystalline silicon film.

14. The seed crystal according to claim 13, wherein the unconformity portion is a silicon oxide film formed by bringing the pre-dipping heat conducting member and the seed into contact with each other at a contact portion and by subsequent oxidation of the contact portion.

15. The seed crystal according to claim 13, wherein the silicon is high-purity silicon.

16. The seed crystal according to claim 15, wherein the high-purity silicon is single crystal silicon.

17. The seed crystal according to claim 15, wherein the high-purity silicon is polycrystalline silicon.

18. The seed crystal according to claim 12, wherein the pre-dipping heat conducting member is made of silicon, and the unconformity portion is a joint surface between silicon members.

19. The seed crystal according to claim 18, wherein the pre-dipping heat conducting member is made of high-purity silicon.

20. The seed crystal according to claim 19, wherein the pre-dipping heat conducting member is made of single crystal silicon.

21. The seed crystal according to claim 20, wherein the pre-dipping heat conducting member has a crystal orientation different from that of the seed.

22. The seed crystal according to claim 20, wherein the pre-dipping heat conducting member has a crystal orientation which is the same as that of the seed.

23. The seed crystal according to claim 19, wherein the pre-dipping heat conducting member is made of polycrystalline silicon.

24. The seed crystal according to claim 1, wherein the unconformity portion is made of any one of an oxide film, a nitride film and a polycrystal film.

25. The seed crystal according to claim 1, wherein the unconformity portion is a contact surface through which the seed crystal and a pre-dipping heat conducting member are in direct contact with each other.

26. The seed crystal according to claim 1, wherein the unconformity portion is an impurity region formed by implanting ions.

27. A method of manufacturing a seed crystal for manufacturing a single crystal, comprising:
    a step for preparing a seed for growing a single crystal;
    a step for preparing a pre-dipping heat conducting member arranged to be dipped in a melt prior to dipping of the seed so as to conduct heat of the melt to the seed and so as to be dissolved into the melt; and
    a step for joining, to each other, the seed and the pre-dipping heat conducting member so as to contact at least a portion of each other face to face.

28. The method of manufacturing a seed crystal for manufacturing a single crystal according to claim 27, wherein the joining step comprises a step for joining the seed and the pre-dipping heat conducting member to each other by heating, in an oxygen atmosphere, the seed and the pre-dipping heat conducting member, at least a portion of each having been contacted with each other face to face.

29. The method of manufacturing a seed crystal for manufacturing a single crystal according to claim 28, wherein the joining step comprises a step for removing an oxide film exposed on a surface of the seed and the pre-dipping heat conducting member by etching the surface after heating the seed and the pre-dipping heat conducting member which have been contacted with each other in an oxygen atmosphere.

30. The method of manufacturing a seed crystal for manufacturing a single crystal comprising:
    a step for preparing a single crystal seed;
    a step for dividing the single crystal seed into two parts; and
    a joining step for joining surfaces of the two parts to each other by heating, in an oxygen atmosphere, the surfaces which have been contacted with each other.

31. The method of manufacturing a seed crystal for manufacturing a single crystal according to claim 30, further comprising:
    a step of forming an oxidation preventive film on the surface of the single crystal seed prior to the dividing step; and
    a step of removing the oxidation preventive film after the joining step.

32. The method of manufacturing a seed crystal for manufacturing a single crystal according to claim 31, wherein the oxidation preventive film is made of silicon nitride.

33. The method of manufacturing a seed crystal for manufacturing a single crystal according to claim 31, wherein the oxidation preventive film is made of resist.

34. A method of manufacturing a seed crystal for manufacturing a single crystal, comprising:
    a step for preparing a seed for growing a single crystal;
    a step for preparing a pre-dipping heat conducting member arranged to be dipped in a melt prior to dipping of the seed so as to conduct the heat of the melt to the seed;
    a step for forming an oxide film on an end surface of at least either of the pre-dipping heat conducting member or the seed; and
    a joining step for joining the seed to the pre-dipping heat conducting member through the oxide film.

35. The method of manufacturing a seed crystal for manufacturing a single crystal according to claim 34, wherein the joining step is performed in a heated state.

36. The method of manufacturing a seed crystal for manufacturing a single crystal according to claim 34, further comprising a step of etching the surface of the seed.

37. A method of manufacturing a seed crystal for manufacturing a single crystal, comprising:
    a step for preparing a seed for growing a single crystal;
    a step for preparing a pre-dipping heat conducting member arranged to be dipped in a melt prior to dipping of the seed so as to conduct the heat of the melt to the seed;
    a step for forming a polycrystalline film on an end surface of at least either of the pre-dipping heat conducting member or the seed; and
    a joining step for joining the seed to the pre-dipping heat conducting member through the polycrystalline film.

38. A method of manufacturing a seed crystal for manufacturing a single crystal, comprising:
    a step for preparing a first plate made of single crystal silicon;
    a step for preparing a second plate made of single crystal silicon and having a silicon oxide film on at least a joint surface thereof;
    a step for forming a joined plate by joining the first and second plates to each other in a superimposed state by applying heat; and
    a step for forming a seed by cutting the joined plate along a surface perpendicular to the joint surface.

39. The method of manufacturing a seed crystal for manufacturing a single crystal according to claim 38, further comprising a step which is performed after the cutting step and in which the surface of the seed produced from the joined plate is etched.

40. The method of manufacturing a seed crystal for manufacturing a single crystal, comprising:
    a step for preparing a single crystal seed; and
    a step for forming an unconformity portion incorporating an impurity region by implanting ions of impurities to traverse a partial depth of the single crystal seed.

41. A method of manufacturing a single crystal such that the single crystal is grown by dipping a seed crystal, with which the single crystal is manufactured and which serves as a start for growth of a crystal, into the surface of a melt of a raw material and by raising the seed crystal, the method comprising:
    a step for bringing, into contact with the melt, a leading end of the seed crystal, which has an unconformity portion formed at a position apart from the leading end of the seed crystal, wherein the unconformity portion is structured to conduct the heat of the melt and interrupt propagation of dislocation caused from thermal stress produced when dipping in the melt has been performed;
    a step for continuing dipping of the seed crystal in the melt until a position above the unconformity portion reaches the melt after contact of the leading end of the seed crystal with the melt; and
    a growing step for growing the single crystal by pulling up the seed crystal after the surface of the melt reaches the position above the unconformity portion.

42. The method of manufacturing a single crystal according to claim 41, wherein the seed crystal incorporates a seed for growing a single crystal and a pre-dipping heat conducting member arranged to be dipped into the melt prior to dipping of the seed for growing a single crystal, and the seed for growing a single crystal is dipped in the melt prior to completion of melting of the pre-dipping heat conducting member in the melt.

43. The method of manufacturing a single crystal according to claim 42, wherein the pre-dipping heat conducting member is constituted by a cylindrical member having an engagement portion arranged to be engaged to the seed at a position of a side portion of the seed and surrounding the seed so as to have a distance from the seed, wherein a leading end of the pre-dipping heat conducting member is structured to project over a leading end of the seed, the method further comprising:

a step of pre-heating the leading end of the seed by enclosing the leading end of the seed by a pre-heating space formed by a portion of the pre-dipping heat conducting member above the surface of the melt and the surface of the melt so as to previously heat the leading end of the seed.

44. The method of manufacturing a single crystal according to claim 41, wherein the seed crystal for manufacturing a single crystal is constituted by a seed for growing a single crystal and a pre-dipping heat conducting member arranged to be dipped into the melt prior to dipping of the seed, wherein the seed has a lower end formed into a conical shape, wherein the pre-dipping heat conducting member has an upper end formed to correspond to the conical shape, wherein the seed and the pre-dipping heat conducting member are brought into intimate contact with each other through an unconformity portion for conducting the heat of the melt and interrupting propagation of dislocation caused from thermal stress produced when dipping in the melt has been performed, and wherein the method further comprises:

a step of moving the seed crystal downwards until the surface of the melt reaches a position above the unconformity portion.

45. The method of manufacturing a single crystal according to claim 41, wherein the seed crystal for manufacturing a single crystal incorporates a seed for growing a single crystal and a pre-dipping heat conducting member arranged to be dipped into the melt prior to dipping of the seed, wherein the seed has a lower end inclined with respect to the surface of the melt, wherein the pre-dipping heat conducting member has an upper end corresponding to the inclination, wherein the seed and the pre-dipping heat conducting member are brought into intimate contact with each other through an unconformity portion structured to conduct the heat of melt and interrupt propagation of dislocation caused from thermal stress produced when dipping in the melt has been performed, wherein the method further comprises:

a step of moving the seed crystal downwards until the surface of the melt reaches a portion above the unconformity portion.

46. A method of manufacturing a single crystal according to claim 41, wherein the seed crystal for manufacturing a single crystal incorporates a seed for growing a single crystal and a pre-dipping heat conducting member arranged to be dipped into the melt prior to dipping of the seed, wherein the seed has a lower end formed to be in parallel with the surface of the melt, wherein the pre-dipping heat conducting member has an upper end corresponding to the parallel shape, wherein the seed and the pre-dipping heat conducting member are brought into intimate contact with each other through an unconformity portion structured to conduct the heat of the melt and interrupt propagation of dislocation caused from thermal stress produced when dipping in the melt has been performed, and wherein the method further comprises:

a step of moving the seed crystal downwards until the surface of the melt reaches a position above the unconformity portion.

47. The method of manufacturing a single crystal according to claim 41, wherein the growing step further includes a step of forming a shoulder portion of the single crystal, immediately shifted after dipping the seed in a non-dislocation state to the melt, without interposing a diameter-reducing step for reducing the diameter of the single crystal.

48. A method of manufacturing a single crystal according to claim 41, wherein the seed crystal is held by a pulling up means through a heat insulating material.

49. A seed crystal for manufacturing a single crystal comprising an unconformity portion formed at a position apart from a leading end of the seed crystal, wherein the unconformity portion is structured to conduct the heat of a melt and interrupt propagation of dislocation caused from thermal stress produced when dipping in the melt has been performed, wherein the seed crystal is entirely made of a single material except for the unconformity portion.

* * * * *